WALTER N. SPARLING
DARYLE MESSNER
JOHN W. DANIELS
*INVENTORS*

*BY* Bruce L Burchard

THEIR ATTORNEY

WALTER N. SPARLING
DARYLE MESSNER
JOHN W. DANIELS
*INVENTORS*

BY Bruce L Birchard

THEIR ATTORNEY

WALTER N. SPARLING
DARYLE MESSNER
JOHN W. DANIELS
*INVENTORS*

BY Bruce L. Birchard

THEIR ATTORNEY

United States Patent Office 3,039,037
Patented June 12, 1962

3,039,037
PUSH-BUTTON TUNING SYSTEM FOR TELEVISION RECEIVERS OR THE LIKE

John W. Daniels, Alhambra, Daryle Messner, Whittier, and Walter N. Sparling, Glendora, Calif., assignors to Hoffman Electronics Corporation, a corporation of California Filed Mar. 28, 1956, Ser. No. 574,529
2 Claims. (Cl. 318—467)

This invention is related to push-button tuning systems in general and, more particularly, to a new type of versatile push-button tuning system for television receivers.

An object of the present invention is to provide a new type of versatile push-button tuning system for television receivers.

A further object of the present invention is to provide a versatile push-button tuning system for television receivers in which the order of the push-button channels may be selected by the operator in accordance with his preferences and with the presence of particular ones of television stations within his geographical location.

A still further object of the present invention is to provide a versatile push-button tuning system for television receivers incorporating a novel channel selection board for enabling the accomplishment of channel sequence selection.

According to the present invention, a television receiver provided with a tuner (of the turret, switch, or silver circle type) and rotatable tuner shaft is equipped with a push-button unit, a drive motor associated with the tuner shaft, and a hunting circuit inter-connecting the push-button unit with the drive motor. The hunting circuit may take any one of the several forms extant. A novel channel selection board interposed between the push-button unit and the drive motor is adapted to receive the several channel lead connectors in any one of a variety of arrangements. Thus, the operator may determine channel sequence at his pleasure. In additional embodiments of the present invention, a second or remote push-button unit is provided, the lead wires from which are coupled to the electrical contacts of the aforementioned channel selection board. By virtue of the selective coupling of the channel lead wires associated with the remote push-button unit to the junction terminals, one is enabled to select channel sequence for the remote push-button unit also.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figure 1:
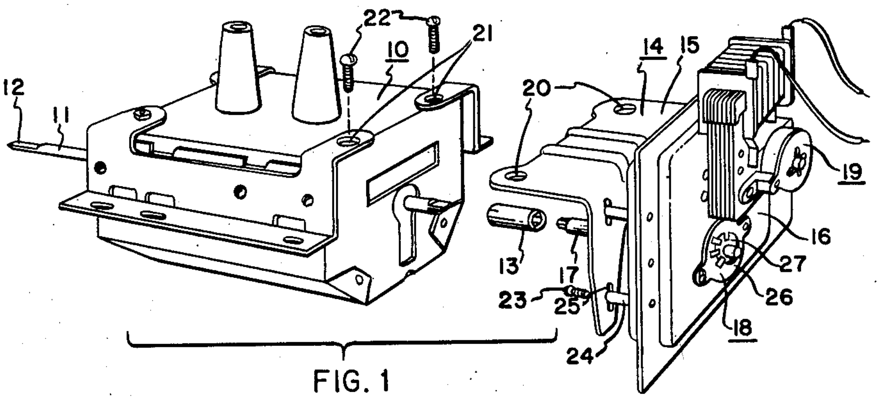
FIGURE 1 is an exploded perspective view of a television receiver turret tuner and drive motor, showing with particularity the coupling therebetween.

In FIGURE 1 there is shown tuner 10 normally included in a television receiver, rotatable tuner shaft 11 provided with tuning knob mounting portion 12, intercoupling bushing 13, and unit 14. Unit 14 is provided with attachment bracket 15, gear train housing 16, drive shaft 17, switching device 18, and motor 19. Bracket 15 is provided with mounting apertures 20 so as to enable the mounting thereof to tuner 10 by means of associated apertures 21 and attachment screws 22. Gear train housing 16 may be affixed to bracket 15 by means of screws 23, internally threaded bosses 24, and access slots 25. Switching device 18 may include an outer member 27 appropriately mounted to gear train housing 16 and alignable by virtue of the slotted apertures shown, and also inner element 27 mounted to drive shaft 17. As is shown, drive shaft 17 may be coupled to shaft 11 of tuner 10 by means of intercooperating bushing 13. It will of course be understood that the end design of shafts 11 and 17 may be such as to enable the deletion of bushing 13 and yet preserve appropriate shaft intercoupling. Motor 19 is physically connected to the gear train included in gear train housing 16 so as to provide power for rotating drive shaft 17.

2

The operation of the apparatus of FIGURE 1 is as follows:

Upon energization of motor 19, drive shaft 17 is caused to rotate, which rotation, by means of the intercoupling between shafts 17 and 11, causes the turret of the tuner to rotate to a new channel selection. The rotation of driven shaft 11 is accomplished by the rotation of inner element 27 of switching device 18 with respect to outer element 26 thereof. Switching device 18 constitutes an essential component in a typical hunting circuit employable in the present invention as is illustrated in FIGURE 2.

Figure 2:
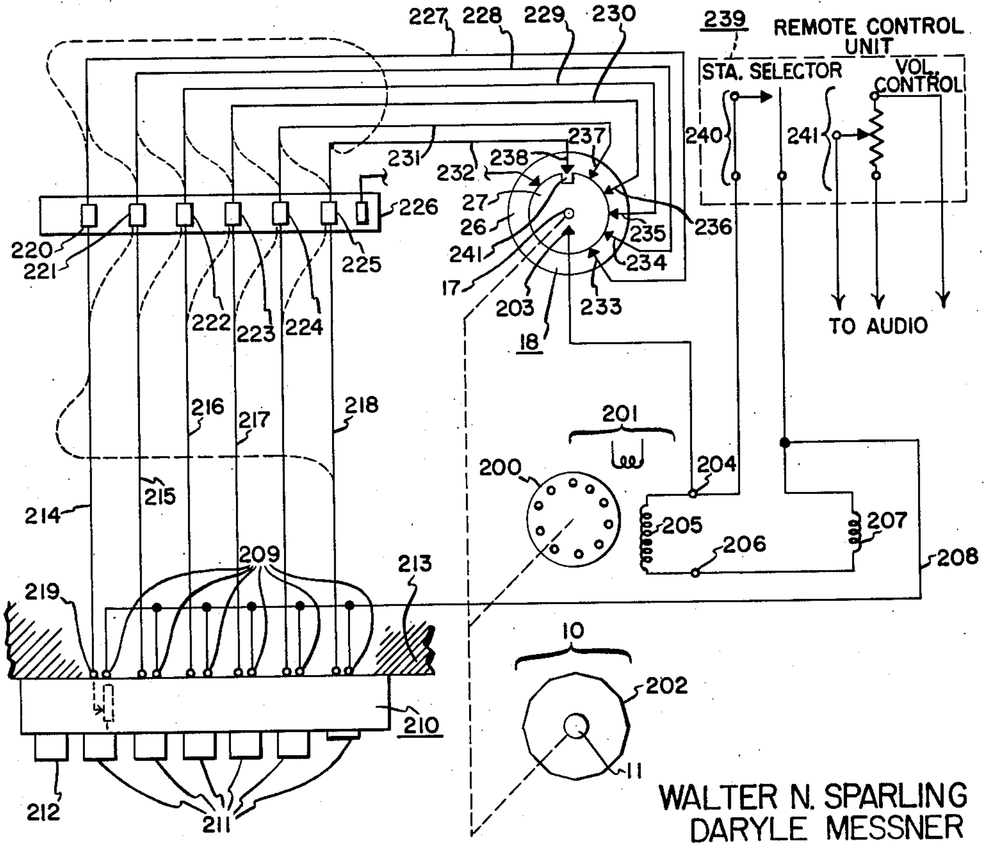
FIGURE 2 is a representation, partially in schematic form, of one form of the television receiver push-button system according to the present invention.

In FIGURE 2, drive shaft 17 upon which element 27 of switching device 18 is mounted is, as has been heretofore described, coupled not only to armature 200 of motor 201 (motor 19 of FIGURE 1) but is also coupled to shaft 11 associated with turret 202 (for example) of tuner 10. Switching device or selector switch 18 is provided with brush type contact 203 which is electrically coupled to terminal 204 of motor armature winding 205. Terminal 206 of motor armature winding 205 is coupled through television receiver transformer winding 207 (or other appropriate power source) to lead 208, which is connected electrically to the several electrical contacts 209 of push-button unit 210.

Push-button unit 210 is provided with a plurality of selectively depressable push-buttons 211 and also with a permissibly includable channel release push-button 212, normally provided in conventional push-button units. If included, the depression of push-button 212 will not only accomplish channel release but will also prepare the equipment for remote control. Push-button unit 210 may be affixed to television cabinet 213 in a conventional manner. Leads 214 through 218 couple respective push-button electrical contacts 219 to associated junction electrical connectors 220 through 225 as are provided on insulating junction strip 226. It will of course be understood that selector switch 18 and strip 226 may each include 13 interassociated contacts, for example. While junction strip 226 may generally be provided, yet strip 226 may be deleted if desired and junction connectors 220 through 225 physically mounted in another manner to the associated television receiver. Wire leads 227 through 232 couple junction electrical connectors 220 through 225 to switching device (selector switch) channel contacts 233 through 238, respectively. A remote control unit 239 may be provided having a simple, station selector switch 240 coupled between transformer winding 207 and motor armature winding 205, as shown, and also a volume control 241 of one of the several types extant. The operation of the apparatus in FIGURE 2 is as follows:

The hunting circuit employed in the present invention will of course include push-button 210, junction connectors 220 through 225, switching device 18, and motor 201. Of course, the hunting circuit will also include station selector switch 240 in remote control unit 239, if employed.

Depression of the push-button shown depressed will close the circuit of lead 208 and lead 218, thus closing the electrical input circuit to motor 201 until electrical contact 238 associated with switching device 18 is disconnected from contact 203 by means of notch 241 in inner element 27, as is shown. At this point, the motor will be shut off and a channel selected according to the relative positioning of turret 202 of turret tuner 10. Depression of additional push-buttons will accomplish the selection of different channels in a manner above described. If it is desired to tune the television set in a conventional manner, as by the rotation of tuning knob 12 in FIGURE 1, then release button 212 in FIGURE 2 may be depressed, which depression will release any electrical contact existing in the circuits of the channel selector push buttons. If desired, the remote control unit 239 of FIGURE 2 may be employed so that the operator may accomplish station selection at a distance from the television receiver, which selection will be accomplished by the selective release of on-off switch 240 at a time when the disposition of turret 202 is such as to select a desired channel.

A particular feature of importance in the present invention is that the junction contacts or connectors 220 through 225 may releasably engage the end terminals (not shown) of leads 214 through 218. Thus, if desired, lead 218 may be routed to junction contact 220, as is shown in dotted line configuration. Similarly, leads 214 through 217 may be routed to other junction contacts as is also shown in dotted line configuration. This feature indicates that by selectively positioning the wire leads 214 through 218 with respect to the junction contacts 220 through 225, the operator may select the channel sequence provided by these several push-buttons 211. This feature of the present invention will be a distinct advantage, in addition, in cases where a family has moved to a different geographical area within the range of reception of television stations operating on different frequencies.

It will of course follow that, rather than vary the disposition of leads 214 through 218, the leads connected to the channel selector contacts of switching device 18 may also be routed in different sequence to the junction connectors 220 through 225, as is indicated by the several dotted line configurations on the other sides of junction strip 226. Conceivably, the electrical connection of the several channel selector contacts of switching device 18 may be varied as desired so as to accomplish the desired push-button sequence of operation.

Figures 3, 4:
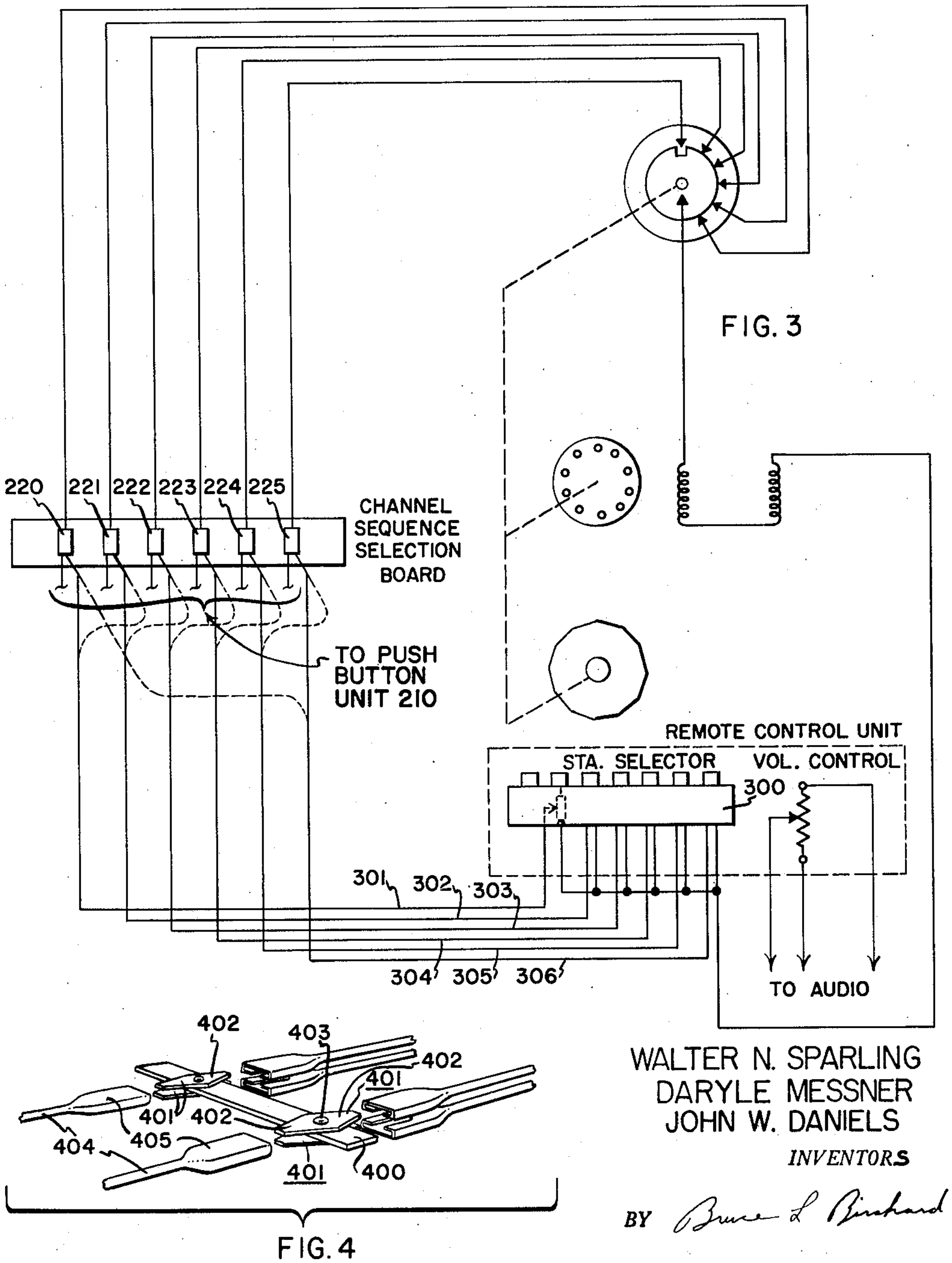
FIGURE 3 is a diagram, partially in schematic form, of an additional embodiment of the television receiver push-button system contemplated by the present invention.
FIGURE 4 is a partial exploded view of a junction terminal strip, or the like, as is employed by the present invention.

FIGURE 3 illustrates that a remote control unit may be provided with a similar push-button unit 300 and leads 301 through 306 therefrom may be selectively joinable to junction contacts 220 through 225. Again, the dotted line configuration shown illustrates that the order of channel selection by means of the remote control push-button unit may be chosen as desired. Of course, brightness, volume, and other controls may be supplied the remote unit. In all other respects, the circuit of FIGURE 3 may remain substantially that of FIGURE 2, with the exception of course also that the simple remote, station selector switch of the remote control unit will be deleted.

There are many types of electrical connectors extant which may be employed in the junction contacts 220 through 225 of FIGURE 2 so as to accomplish selective connection by the several channel leads thereto. Some difficulty has been incurred, however, in finding as a standard part a suitable yet inexpensive connection means as in the case of the junction contact of FIGURE 3. Accordingly, there has been devised suitable apparatus serving as a junction contact strip, as is shown in FIGURE 4.

In FIGURE 4, two-sided insulating strip 400 is provided with electrical contacts 401 each having double tapered ends 402 and therefore constitutes a junction terminal strip. Contact elements 401 may be flat if desired and disposed on both sides of insulating junction strip 400 so that each is disposed in cooperative relationship with an additional junction contact element 401. Thus, the two junction contacts 401 may be secured to junction strip 400 and to each other (so as to provide electrical connection therebetween) by means of appropriate eyelet rivets 403 as shown. The wire leads 104 may accordingly be provided with cooperating end terminals 405 adapted for selective engagement with the several end portions 402 of junction contacts 401.

Thus, the channel sequence selection board of FIGURE 3 may comprise the strip 400 in FIGURE 4 with the wire leads, running from the selection board to the remote control unit and also to the push-button unit 210 (see FIGURE 3), being provided with end terminals 405 as shown on the right side of FIGURE 4; and with the wire leads, running from the channel sequence selection board to the hunting circuit switching device in FIGURE 3 (similar to switching device 18 in FIGURE 2), being provided with end terminals 405 as shown on the left side of FIGURE 4. It will of course be understood that, to readjust channel sequence, either the former group of the aforementioned wire leads or the latter group of wire leads may be reoriented with respect to the channel sequence selection board as is suggested by the dotted line, wire lead configurations of FIGURE 2.

Figure 5:
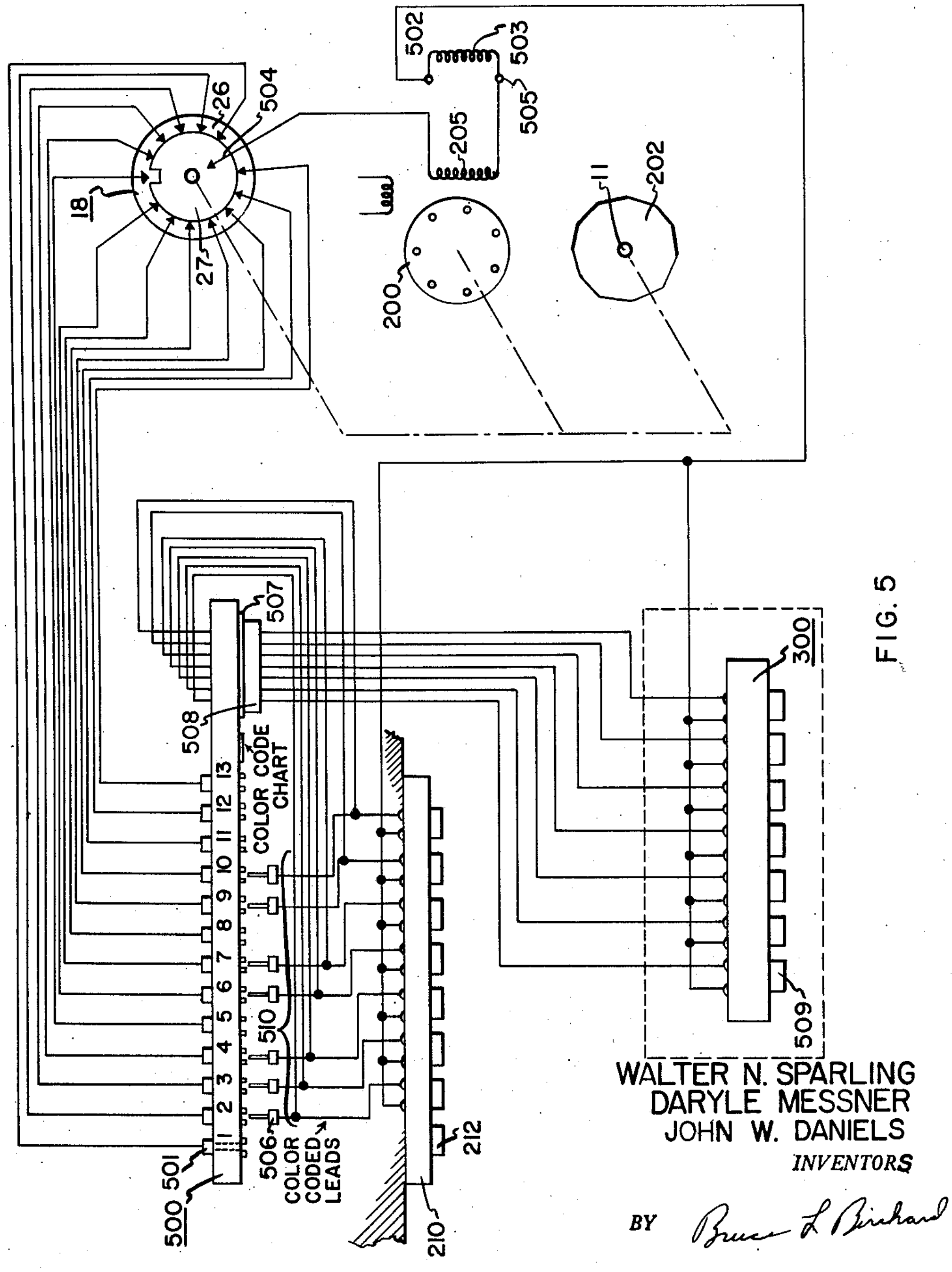
FIGURE 5 is an additional embodiment of the present invention.

In FIGURE 5, channel selection board 500 is provided with a plurality of plug-in electrical receptacles 501, electrical leads from which are connected to the plurality of electrical contacts associated with selector switch 18, as shown. One set of contacts from push-button unit 210, together with one set of contacts from remote control push-button unit 300 are electrically connected to terminal 502 of transformer winding 503. Wiping contact 504 associated with switch 18 is coupled through motor armature winding 205 to terminal 505 of transformer winding 503. The remaining set of electrical contacts of push-button unit 210 are connected as shown both to plug-in electrical connectors 506 and also to electrical socket 507, as shown, mounted upon channel selection board 500. The remaining electrical contacts of push-button unit 300 are electrically connected as shown to socket plug 508 which is selectively engagable with electrical socket 507. Push-buttons 212 and 509 are again permissively includable channel release buttons. Channel selection board 500 and push-button unit 210 are appropriately mounted to the television receiver (not shown).

The operation of the apparatus of FIGURE 5 is as follows. Each of the several channels is appropriately numbered on the channel selection board, as shown. Wire leads 510 are appropriately color coded with a color coding marker suitably placed either upon the push-button 210 or, perhaps preferably, upon the channel selection board itself (as shown). Thus, the television receiver owner, upon becoming desirous of selecting a new channel sequence for push-button units 210 and 300, may appropriately push plug-in terminals 506 within the desired ones of receptacles 501. By virtue of the integral operation of electrical socket 507 and socket plug 508, there will be determined simultaneously the channel sequence for remote control push-button 300. In other respects, the apparatus of channel 5 will operate in a similar manner to the apparatus before mentioned.

While particular embodiments of the present invention have been shown and described, it will be obvious to those skilled in the art that changes and modifications may be made without departing from this invention in its broader aspects, and, therefore, the aim in the appended claims is to cover all such changes and modifications as fall within the true spirit and scope of this invention.

We claim:

1. In a pushbutton-controlled tuner for television receivers or the like, of the type including a tuner shaft positionable at discrete positions for channel selection purposes, an electric motor connected to said tuner shaft to rotate the latter through its positions in turn, a control circuit for said motor, a rotary switch connected to be driven by said motor in step with the rotation of said tuner shaft and including a plurality of tuner shaft position-defining contacts and a common contact element cooperating with said position-defining contacts, said switch being connected to said motor control circuit to interrupt the operation of said motor and thereby to stop said tuner shaft at a position defined by the existence of a control potential upon a selected one of said position-defining contacts, and a plurality of pushbutton-controlled contact sets adapted to be connected from said motor control circuit to the respective ones of said position-defining contacts to control the selection of the stopping position of said tuner shaft, the improvement which comprises a junction strip including a plurality of spaced conductive connectors, a first group of individual conductors connected at one end of each to respective contacts of said pushbutton-controlled contact sets, a second group of individual conductors connected at one end of each to respective ones of said position-defining contacts of said rotary switch, the opposite ends of the conductors of one of said groups each including a terminal portion in readily-removable slip-joint contact-making engagement with a respective one of said junction strip connectors, and means connecting the opposite ends of the conductors of the other group also to said junction strip connectors, whereby to permit any desired combinatorial interconnection of said pushbutton-controlled contact sets with the position-defining contacts of said rotary switch.

2. Apparatus in accordance with claim 1, in which the opposite ends of the conductors of the other of said groups also each include a terminal portion in readily-removable slip-joint contact-making engagement with a respective one of said junction strip connectors, to constitute said last-named connecting means.

References Cited in the file of this patent

UNITED STATES PATENTS

| | | |
|---|---|---|
| 1,962,487 | Douglas | June 12, 1934 |
| 2,317,710 | Anderson | Apr. 27, 1943 |
| 2,520,749 | Ware et al. | Aug. 29, 1950 |
| 2,755,424 | Papitto | July 17, 1956 |
| 2,760,139 | Luebking | Aug. 21, 1956 |
| 2,762,961 | Colby | Sept. 11, 1956 |
| 2,796,574 | Hatfield | June 18, 1957 |
| 2,802,978 | Legros | Aug. 13, 1957 |

UNITED STATES PATENT OFFICE

CERTIFICATE OF CORRECTION

Patent No. 3,039,037 June 12, 1962

John W. Daniels et al.

It is hereby certified that error appears in the above numbered patent requiring correction and that the said Letters Patent should read as corrected below.

Column 2, line 24, for "accomplished" read -- accompanied --; column 4, line 4, for "104" read -- 404 --.

Signed and sealed this 16th day of October 1962.

(SEAL)
Attest:

ERNEST W. SWIDER
Attesting Officer

DAVID L. LADD
Commissioner of Patents